(12) United States Patent  (10) Patent No.: US 7,405,919 B2
Mitsui  (45) Date of Patent: Jul. 29, 2008

(54) ELECTRONIC CIRCUIT HAVING TRANSMISSION LINE TYPE NOISE FILTER

(75) Inventor: Kazuaki Mitsui, Tokyo (JP)

(73) Assignee: Sony Computer Entertainment Inc., Tokyo (JP)

( * ) Notice: Subject to any disclaimer, the term of this patent is extended or adjusted under 35 U.S.C. 154(b) by 57 days.

(21) Appl. No.: 11/473,341

(22) Filed: Jun. 22, 2006

(65) Prior Publication Data

US 2007/0075696 A1 Apr. 5, 2007

(30) Foreign Application Priority Data

Oct. 4, 2005 (JP) ............................. 2005-290983

(51) Int. Cl.
*G03G 15/02* (2006.01)
(52) U.S. Cl. .................. 361/235; 307/105; 361/601; 361/760; 361/790; 361/792; 361/794
(58) Field of Classification Search ................ 361/700, 361/235, 601; 327/524, 551, 552, 558; 307/105
See application file for complete search history.

(56) References Cited

U.S. PATENT DOCUMENTS

| | | | | |
|---|---|---|---|---|
| 4,063,229 A | * | 12/1977 | Welsh et al. ................. | 340/571 |
| 4,963,966 A | * | 10/1990 | Harney et al. ................ | 725/149 |
| 5,619,079 A | * | 4/1997 | Wiggins et al. ............... | 307/89 |
| 6,154,086 A | * | 11/2000 | Manolescu ................... | 327/419 |
| 6,198,362 B1 | * | 3/2001 | Harada et al. ................. | 333/12 |
| 6,418,031 B1 | * | 7/2002 | Archambeault ............. | 361/762 |
| 6,798,666 B1 | * | 9/2004 | Alexander et al. ........... | 361/766 |
| 7,068,518 B2 | * | 6/2006 | Ueno et al. ................... | 361/760 |
| 2003/0024732 A1 | * | 2/2003 | Ninomiya .................... | 174/255 |
| 2003/0231085 A1 | * | 12/2003 | Arai et al. .................... | 333/204 |
| 2004/0090748 A1 | * | 5/2004 | Kishimoto et al. .......... | 361/719 |
| 2005/0018374 A1 | * | 1/2005 | Anthony ...................... | 361/118 |
| 2005/0057381 A1 | * | 3/2005 | Fletcher et al. .............. | 341/131 |

FOREIGN PATENT DOCUMENTS

JP 2003-347691 12/2003
JP 2004-088769 3/2004

* cited by examiner

*Primary Examiner*—Dean A. Reichard
*Assistant Examiner*—Hoa C Nguyen
(74) *Attorney, Agent, or Firm*—Katten Muchin Rosenman LLP

(57) ABSTRACT

A power supply circuit produces a supply voltage to be supplied to a microprocessor which is an integrated circuit. A transmission line type noise filter includes a signal input terminal, a signal output terminal and two ground terminals corresponding respectively to the signal input terminal and the signal output terminal. The transmission line type noise filter eliminates a high-frequency component of DC voltage applied to the signal input terminal and outputs it from the signal output terminal. A first power supply line pattern, formed on a printed-circuit board, connects an output terminal of the power supply circuit with the signal input terminal of the transmission line type noise filter. A second power supply line pattern connects the signal output terminal of the transmission line type noise filter with a power supply terminal of the microprocessor. A ground land pattern is connected with an external ground potential through via holes and makes a connection between the two ground terminals.

10 Claims, 5 Drawing Sheets

ELECTRONIC CIRCUIT HAVING TRANSMISSION LINE TYPE NOISE FILTER

BACKGROUND OF THE INVENTION

1. Field of the Invention

The present invention relates to an electronic circuit that supplies a supply voltage to a microprocessor such as CPU.

2. Description of the Related Art

A predetermined power supply voltage, which is stabilized by a power supply circuit such as a voltage regulator circuit, is supplied to CPUs, graphic processors and the like (hereinafter referred to collectively as "microprocessors"), which are used in personal computers, workstations, game machines and the like.

In the path supplying a power supply voltage to a microprocessor, a decoupling capacitor is provided between the power line and the grounding in order to remove noises occurring in the voltage regulator circuit or prevent the leakage to the outside of high-frequency noises occurring in the microprocessor. Noise removal by a decoupling capacitor is now a very important technology for stable operation of devices outfitted with a microprocessor or for the reduction of EMI (Electro-Magnetic Interference).

As a decoupling capacitor, a tantalum capacitor, an electrolytic capacitor or a ceramic capacitor is used generally. And several to several tens of decoupling capacitors, which are used on a printed-circuit board having a microprocessor, tend to occupy a considerable area. Also, the cost of surface-mounting a large number of decoupling capacitors can be significant.

Thus attempts are being made to use transmission line type noise filters instead of decoupling capacitors (See Reference (1) and Reference (2) in the following Related Art List, for instance). Such transmission line type noise filters are distributed constant filters, which are characterized by their capacity to remove noises over an extremely wide band.

RELATED ART LIST (1) Japanese Patent Application Laid-Open No. 2003-347691.

(2) Japanese Patent Application Laid-Open No. 2004-88769.

In recent years, the clock frequency of microprocessors has kept rising, and along with it noises generated can even reach a frequency band of several GHz. The performance of a transmission line type noise filter based on a distributed constant design can be greatly affected by the wiring pattern of the printed-circuit board on which it is mounted. Such effects are more conspicuous in the higher-frequency components of noise. Hence, in order to optimally remove noises in the frequency band reaching several GHz, the placement of the transmission line type noise filter and the wiring pattern of the printed-circuit board must be designed carefully.

SUMMARY OF THE INVENTION

The present invention has been made in view of the foregoing circumstances, and a general purpose thereof is to provide an electronic circuit for which a power supply circuit and an integrated circuit are effectively decoupled by a transmission line type noise filter.

An electronic circuit according to one embodiment of the present invention comprises: a power supply circuit which generates a supply voltage to be supplied to an integrated circuit; a transmission line type noise filter, comprised of a signal input terminal, a signal output terminal and two ground terminals corresponding respectively to the signal input terminal and the signal output terminal, which removes a high-frequency component of direct-current voltage applied to the signal input terminal and outputs it from the signal output terminal; and a printed-circuit board on which the power supply circuit and the transmission line type noise filter are mounted on a same surface thereof. The printed-circuit board includes: a first power supply line pattern which connects an output terminal of the power supply circuit with the signal input terminal of the transmission line type noise filter; a second power supply line pattern which connects the signal output terminal of the transmission line type noise filter with a power supply terminal of the integrated circuit; and a ground land pattern, connected with an external ground potential, which makes a connection between the two ground terminals, wherein the first power supply line pattern, the second power supply line pattern and the ground land pattern are formed on a mounting surface of the power supply circuit and the transmission line type noise filter.

According to this embodiment, the frequency characteristic at the time when the transmission line type noise filter is mounted on a printed-circuit board is brought close to that of the transmission line type noise filter alone, so that the noise components can be optimally eliminated.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
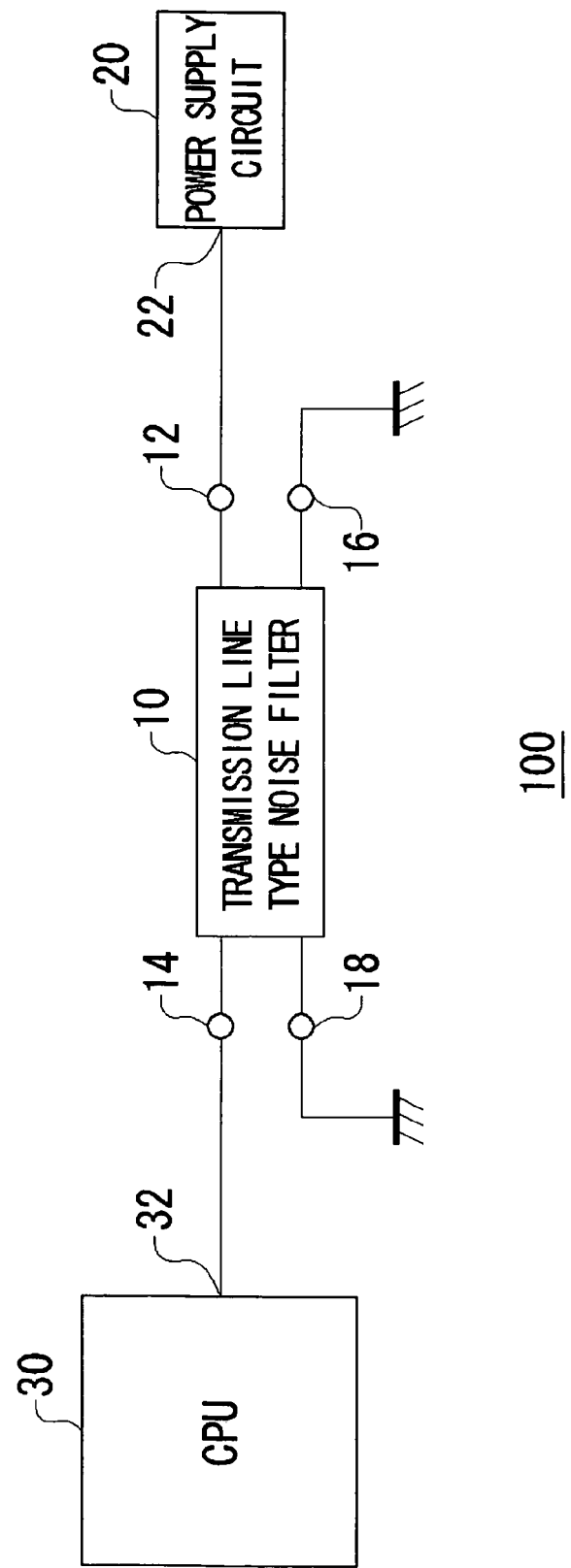
FIG. 1 is a block diagram showing an overall structure of an electronic circuit according to an embodiment of the present invention.

The invention will now be described by reference to the preferred embodiments. This does not intend to limit the scope of the present invention, but to exemplify the invention. All of the features and the combinations thereof described in the embodiment are not necessarily essential to the invention.

An outline of an electronic circuit according to an embodiment will be described first. This electronic circuit is used for electronic equipment such as a personal computer and a game machine, and the supply voltage produced by a power supply circuit is supplied to a microprocessor.

An electronic circuit according to an embodiment of the present invention comprises: a power supply circuit which generates a supply voltage to be supplied to an integrated circuit; a transmission line type noise filter, comprised of a signal input terminal, a signal output terminal and two ground terminals corresponding respectively to the signal input terminal and the signal output terminal, which removes a high-frequency component of direct-current voltage applied to the signal input terminal and outputs it from the signal output terminal; and a printed-circuit board on which the power supply circuit and the transmission line type noise filter are mounted on the same surface thereof. The printed-circuit board includes: a first power supply line pattern which connects an output terminal of the power supply circuit with the signal input terminal of the transmission line type noise filter; a second power supply line pattern which connects the signal output terminal of the transmission line type noise filter with a power supply terminal of the integrated circuit; and a ground land pattern, connected with an external ground potential, which makes a connection between the two ground terminals, wherein the first power supply line pattern, the second power supply line pattern and the ground land pattern are formed on a mounting surface of the power supply circuit and the transmission line type noise filter.

According to this embodiment, an excellent ground potential can be supplied to a ground terminal of a transmission line type noise filter. As a result, the frequency characteristic at the time when the transmission line type noise filter is mounted on a printed-circuit board is brought close to that of the transmission line type noise filter alone and the noise components can be optimally eliminated, thus realizing an excellent decoupling.

The printed-circuit board may have a multilayer structure. The first power supply line pattern and the second power supply pattern may include at least two wiring patterns which are formed on different layers and connected through via holes.

Accordingly, the first and the second power apparatus line pattern are formed in a plurality of wiring layers and connected in parallel through via holes. Hence the impedance of the power line is lowered, so that the power loss due to voltage drop can be reduced and an integrated circuit in which high currents flow can be driven stably.

The printed-circuit board may have a multilayer structure. The ground land pattern may include at least two wiring patterns which are formed on different layers and mutually connected through via holes.

Accordingly, the ground land pattern is formed in a plurality of wiring layers. Hence the resistance component and the inductor component can be reduced and a further stable ground potential can be supplied. As a result, the noise can be effectively and optimally eliminated.

The transmission line type noise filter is provided in a plurality thereof, and the ground land pattern may be formed as a single pattern which connects all ground terminals of the plurality of transmission line type noise filters.

By employing such a structure that there are provided a plurality of transmission line type noise filters, the direct-current impedance can be lowered. Furthermore, by employing such a structure that the ground terminals of all the transmission line type noise filters are connected together by a single pattern, excellent decoupling characteristics can be obtained.

The electronic circuit may further comprise a transmission line type noise filter mounted on a second mounting surface which differs from a mounting surface of the integrated circuit. The printed-circuit board may include: a third power supply line pattern, connected with the first power supply line pattern through via holes, which connects an output terminal of the power supply circuit with the signal input terminal of the transmission line type noise filter mounted on the second mounting surface; a fourth power supply line pattern, connected with the second power supply line pattern through via holes, which connects the signal output terminal of the transmission line type noise filter mounted on the second mounting surface with a power supply terminal of the integrated circuit; and a second ground land pattern, connected with the ground land pattern through via holes, which makes a connection between the two ground terminals of the transmission line type noise filter mounted on the second mounting surface, wherein the third power supply line pattern, the fourth power supply line pattern and the second ground land pattern are formed on the second mounting surface.

By employing such a structure that the transmission line type noise filters are mounted on both the surfaces of the printed-circuited board, the area can be effectively utilized and the printed circuit board can be made smaller in size.

The printed-circuit board may have a multilayer structure and have at least five wiring layers. The first power supply line pattern, the second power supply line pattern and the ground land pattern may be each formed on a first wiring layer, a third wiring layer and a fifth wiring layer in such a manner as to overlap with one other and they may be connected through via holes. A ground layer connected with the ground land pattern through via holes may be provided on the second wiring layer and the fourth wiring layer.

By employing such a structure that a ground layer is provided between the wiring layers on which the first and the second power supply line pattern are formed, the isolation between each wiring can be improved and the noise can be optimally removed. A structure having six or more layers may be provided by inserting still another layer.

It is to be noted that any arbitrary combination of the above-described components and the implementation of constituent elements or expression of the present invention in the form of a method, an apparatus, a system and so forth are also effective as and encompassed by the embodiments of the present invention. A detailed description will be given hereinbelow of an electronic apparatus according to the embodiments of the present invention with reference to Figures.

FIG. 1 is a block diagram showing an overall structure of an electronic circuit 100 according to an embodiment of the present invention. The electronic circuit 100 is contained in electronic equipment such as a personal computer and a game machine, and is comprised of a microprocessor 30 serving as a CPU, a power supply circuit 20 which generates a supply voltage to be supplied to the microprocessor 30, and a transmission line type noise filter 10 for eliminating noises. In the remaining Figures, the same reference numerals are assigned to the same or similar components and the repeated description thereof will be omitted as appropriate.

The microprocessor 30 is an integrated circuit that performs an integrated arithmetic processing in electronic equipment having the electronic circuit 100. The microprocessor 30 operates when the supply voltage of about 1.0 to 1.2 V is supplied to a power supply terminal 32.

The power supply circuit 20 produces a supply voltage to be supplied to the microprocessor 30 and outputs the supply voltage from an output terminal 22. The power supply circuit 20 is a so-called voltage regulator circuit and performs a voltage feedback control so that the generated supply voltage can be brought closer to a predetermined value. As a result, even if the impedance of the microprocessor 30 varies so as to change the output current or the temperature varies, the supply voltage which is the output of the power supply circuit 20 will be kept to a constant value.

A transmission line type noise filter 10 is provided on a path through which the power is supplied from the power supply circuit 20 to the microprocessor 30. This transmission line type noise filter 10 is a distributed constant filter, and is comprised of a signal input terminal 12, a signal output terminal 14 and two ground terminals 16 corresponding thereto. The signal input terminal 12 is connected to an output terminal of the power supply circuit 20, and the supply voltage is applied thereto. The signal output terminal 14 is connected to a power supply terminal 32 of the microprocessor 30. The transmission line type noise filter 10 removes the noise components of a direct-current supply voltage inputted to the signal input terminal 12 and outputs it from the signal output terminal 14. The transmission line type noise filter 10 achieves a function of preventing high-frequency noises caused in the microprocessor 30, from being leaked to the power supply circuit 20 side.

Figure 2:
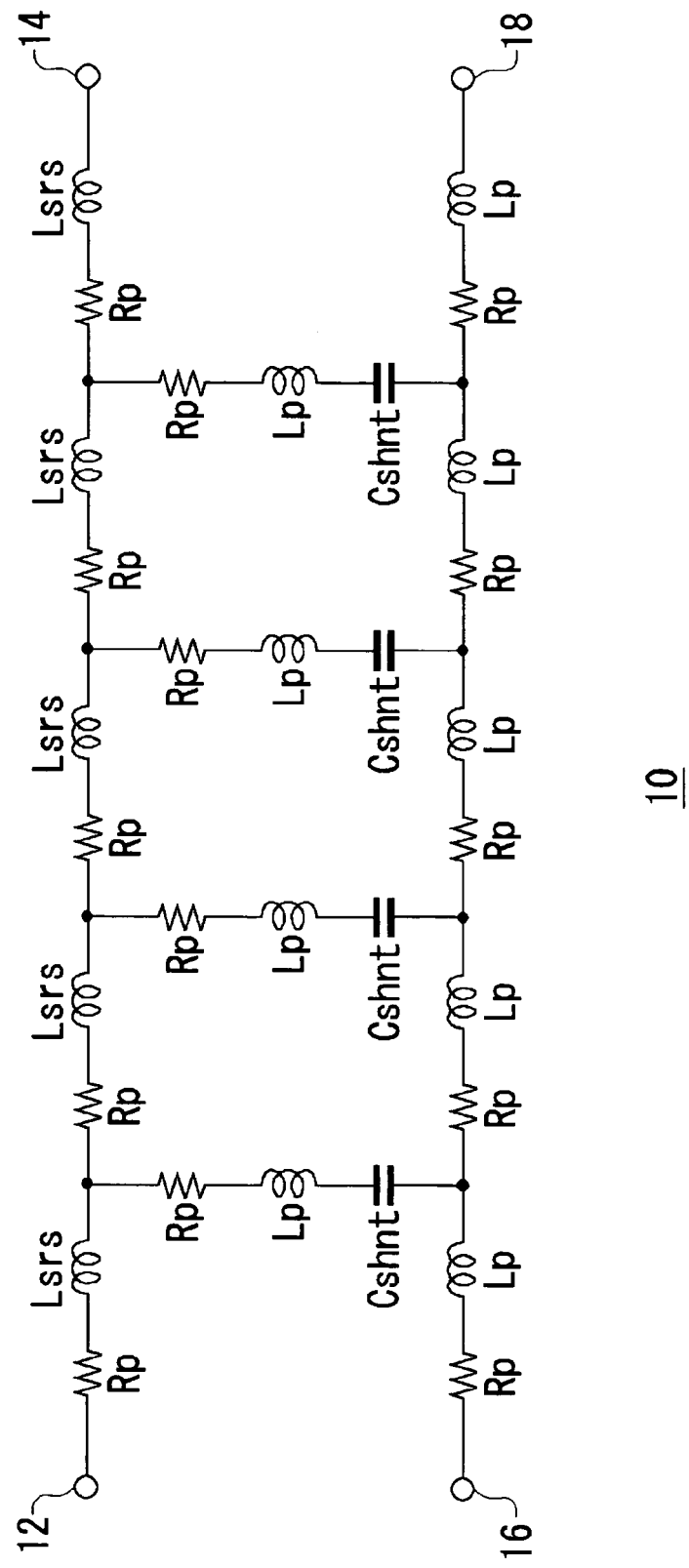
FIG. 2 illustrates an equivalent circuit diagram of a transmission line type noise filter shown in FIG. 1.

FIG. 2 illustrates an equivalent circuit of the transmission line type noise filter 10 shown in FIG. 1. The transmission line type noise filter 10 is a distributed constant lowpass filter, and includes, as main constituent elements, series inductors Lsrs connected in series between the signal input terminal 12 and the signal output terminal 14, a path which connects the signal input terminal 12 to the signal output terminal 14, and shunt capacitors Cshnt connected with a ground. The transmission line type noise filter 10 further includes parasitic resistance components Rp and parasitic inductor components Lp.

A first ground terminal 16 and a second ground terminal 18 are ground terminals, associated with the signal input terminal 12 and the signal output terminal 14, respectively, and these ground terminals are connected together by a conductor inside the transmission line type noise filter 10. However, in fact there exist the resistance components Rs and inductor components Lp of the conductor between the first ground terminal 16 and the second ground terminal 18. Further, the first ground terminal 16 and the second ground terminal 18 are grounded via the inductance components and resistance components of wiring patterns on a printed-circuit board mounted on the transmission line type noise filter 10.

Referring back to FIG. 1, a transmission line type noise filter 10, a power supply circuit 20 and a microprocessor 30 are mounted on a printed-circuit board. The noise removal characteristics in the transmission line type noise filter 10 is greatly affected by the packaging layout and wiring pattern.

A description will now be given of a structure of a printed-circuit board to achieve satisfactory noise removal in the electronic apparatus according to the present embodiment.

Figure 3:
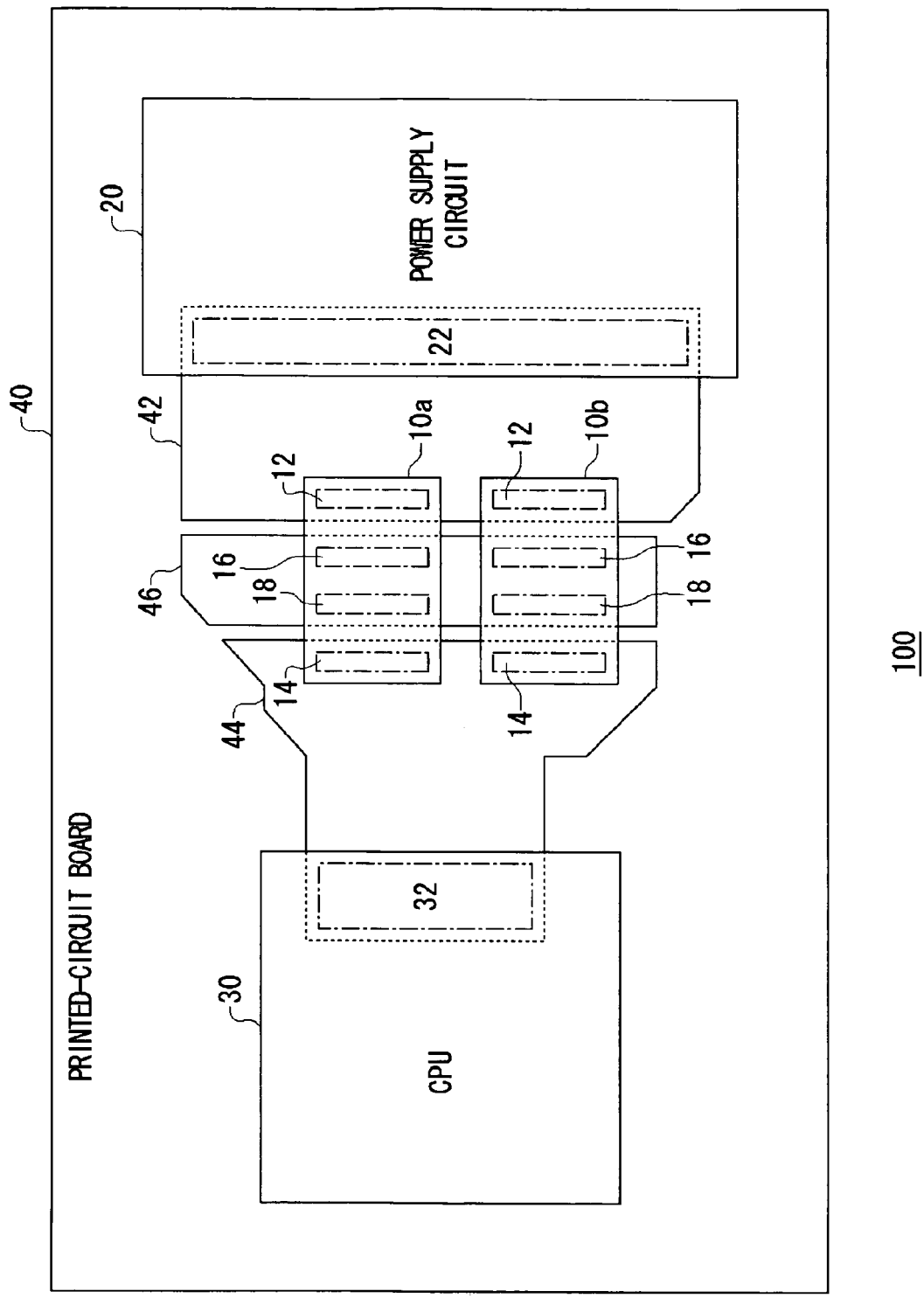
FIG. 3 illustrates a layout of an electronic circuit according to an embodiment of the present invention, and is a top view of the electronic circuit.

FIG. 3 illustrates a layout of the electronic circuit 100 according to the present embodiment and is a top view thereof. The electronic circuit 100 is comprised of a power supply circuit 20, a microprocessor 30, two transmission line type noise filters 10a and 10b, and a printed-circuit board 40. In FIG. 3, the respective terminals of the transmission line type noise filter 10, the power supply circuit 20 and the microprocessor 30 are indicated by portions encircled by dashed lines. Parts of wiring patterns hidden by the transmission line type noise filter 10, the power supply circuit 20 and the microprocessor 30 are indicated by dotted lines in FIG. 3.

It is assumed that high currents of several tens up to over 100 A flow to a microprocessor 30 according to the present embodiment. Accordingly, there will be conspicuous voltage drops and power consumption on account of the resistance component of the transmission line type noise filter 10. In the present embodiment, therefore, a plurality of transmission line type noise filters 10 are connected in parallel to lower the impedance and reduce wasteful power consumption. The number of transmission line type noise filters 10 to be connected in parallel may be determined according to the series resistance component of the transmission line type noise filters 10 and the current consumption of the microprocessor 30. Hence, three or more transmission line type noise filters 10 may be connected in parallel.

The power supply circuit 20 is mounted on the top surface of a printed-circuit board 40. Also, two transmission line type noise filters 10a and 10b are mounted on the same surface (hereinafter referred to as "first mounting surface" also) as the power supply circuit 20.

The printed-circuit board 40 is provided with a first power supply line pattern 42, a second power supply line pattern 44, and a ground land pattern 46. The first power supply line pattern 42, the second power supply line pattern 44 and the ground land pattern 46 are all formed on the first mounting surface on which the power supply circuit 20 and the transmission line type noise filters 10a and 10b are mounted.

The first power supply line pattern 42 connects an output terminal 22 of the power supply circuit 20 to the signal input terminals 12 of the transmission line type noise filters 10a and 10b, respectively. The second power supply line pattern 44 connects the signal output terminals 14 of the transmission line type noise filters 10a and 10b, respectively, to a power supply terminal 32 of the microprocessor 30.

The ground land pattern 46 connects together two ground terminals 16 and 18 which are provided on each of the transmission line type noise filters 10a and 10b. The ground land pattern 46 is connected to an external ground potential by way of via holes (not shown). As shown in FIG. 3, the ground land pattern 46 is formed as a single pattern that connects together all the ground terminals 16 and 18 of a plurality of transmission line type noise filters 10a and 10b.

Figure 4A:
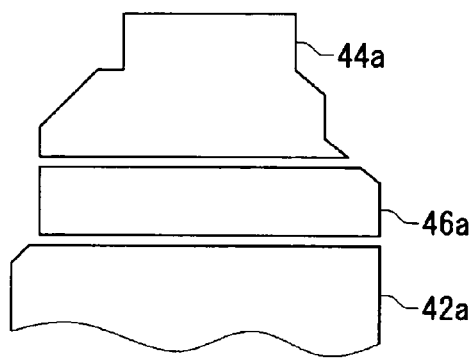
FIGS. 4A to 4C illustrate the wiring patterns of main parts of a printed-circuit board of FIG. 3.
Figure 4B:
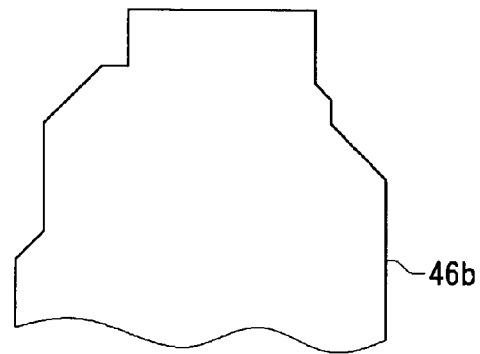
Figure 4C:
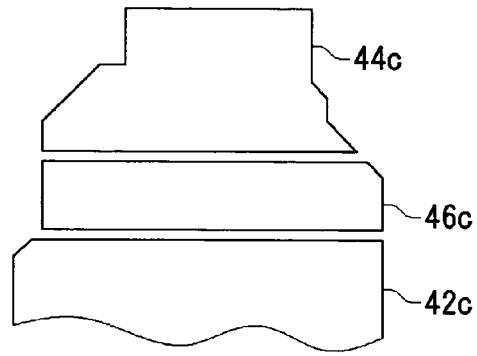

The printed-circuit board 40 as shown in FIG. 3 may, for instance, has a multilayer structure including at least three wiring layers. FIGS. 4A to 4C illustrate the wiring patterns of the main parts of a printed-circuit board 40 of FIG. 3. FIGS. 4A to 4C show, in order, the wiring patterns of a first layer (first mounting surface), the wiring pattern of a second layer, and the wiring patterns of the third layer. As shown in FIG. 4A, a first power supply line pattern 42a, a second power supply line pattern 44a, and a ground land pattern 46a are formed on the first layer, which is the top layer of the printed-circuit board 40. These wiring patterns correspond to the first power supply line pattern 42, the second power supply line pattern 44, and the ground land pattern 46 shown in FIG. 3.

As shown in FIG. 4B, a ground land pattern 46b is formed on the second layer of the printed-circuit board 40. This ground land pattern 46b is so formed as to overlap the area covered by the first power supply line pattern 42a, the second power supply line pattern 44a, and the ground land pattern 46a formed on the first layer. The ground land pattern 46a and the ground land pattern 46b are connected to each other by via holes (not shown).

As shown in FIG. 4C, a first power supply line pattern 42c, a second power supply line pattern 44c, and a ground land pattern 46c are formed on the third layer of the printed-circuit board 40. The wiring patterns of the third layer are designed to have substantially the same shape as the wiring pattern of the first layer. The first power supply line pattern 42c and the second power supply line pattern 44c are connected respectively with the first power supply line pattern 42a and the second power supply line pattern 44a of the first layer by the respective via holes (not shown). The ground land pattern 46c is connected to the ground land pattern 46b of the second layer through via holes (not shown). Further, the ground land pattern 46c is connected to an external ground potential through via holes.

As described above, a printed-circuit board 40 of an electronic circuit 100 according to the present embodiment is formed on different layers and includes three ground land patterns 46a, 46b and 46c connected together through via holes. The first power supply line pattern 42 thereof includes first power supply line patterns 42a and 42c which is formed on different layers and connected to each other by via holes. Similarly, a second power supply line pattern 44 thereof, which is formed on different layers, includes second power supply line patterns 44a and 44c connected to each other by via holes.

According to an electronic circuit 100 implementing the above structure, the transmission line type noise filter 10 can be grounded ideally with a single ground land pattern 46, connecting all the ground terminals 16 and 18 of the transmission line type noise filter 10, formed on the top layer of a printed-circuit board 40. As a result, noises occurring in the power supply circuit 20 can be removed, or the leakage of high-frequency noises occurring in the microprocessor 30 to the outside can be prevented effectively and optimally.

It has been experimentally confirmed that isolation between the power supply circuit 20 and the microprocessor 30 will be aggravated if all the ground terminals 16 and 18 of a transmission line type noise filter 10 are not connected on the first mounting surface but are connected at the ground land pattern 46b on the second layer by way of via holes provided directly underneath their respective terminals. This proves that excellent decoupling characteristics may be produced by the arrangement of a printed-circuit board 40 according to the present embodiment where the ground terminals 16 and 18 of a transmission line type noise filter 10 are connected by wiring without the use of via holes.

Now a description will be given of a modification of an electronic circuit 100 of FIG. 3. An electronic circuit 100 according to this modification may be used in applications where currents even larger than those for the electronic circuit 100 of FIG. 3 flow to the microprocessor 30. An electronic circuit 100 according to this modification is provided not only with transmission line type noise filters 10a and 10b mounted on a first mounting surface where the power supply circuit 20 and the microprocessor 30 are mounted, but also with additional two transmission line type noise filters 10c and 10d mounted on the back thereof (hereinafter referred to as "second mounting surface" also).

The printed-circuit board 40 of an electronic circuit 100 according to the present modification may, for instance, has a multilayer structure including eight wiring layers. FIGS. 5A to 5H illustrate the wiring patterns of the main parts of a printed-circuit board 40 of an electronic circuit 100 according to the present modification. FIGS. 5A to 5H show, in order, the wiring patterns of the first to eighth layers.

Figure 5A:
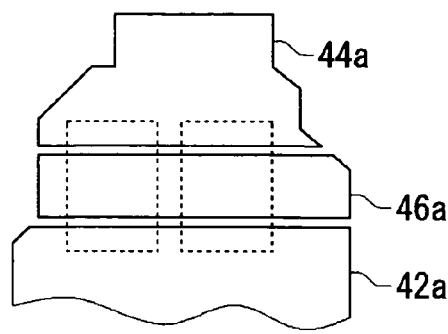
FIGS. 5A to 5H illustrate the wiring patterns of main parts of a printed-circuit board in an electronic circuit according to a modification to an embodiment of the present invention.
Figure 5B:
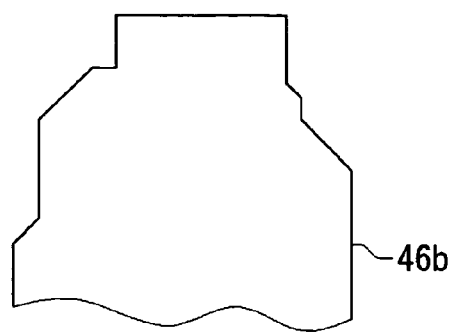
Figure 5C:
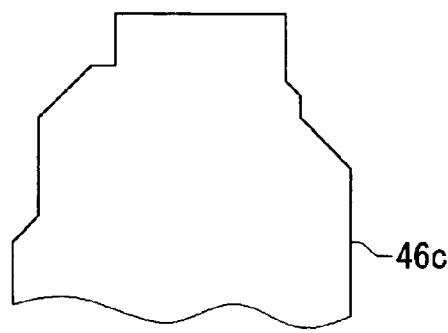
Figure 5D:
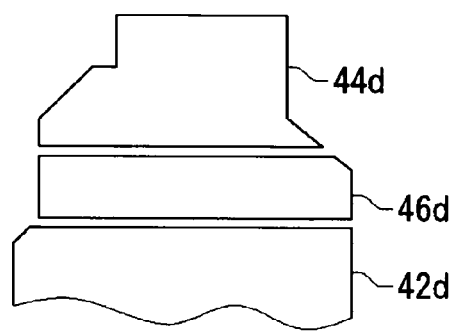
Figure 5E:
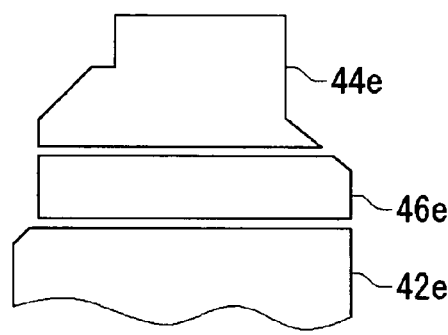
Figure 5F:
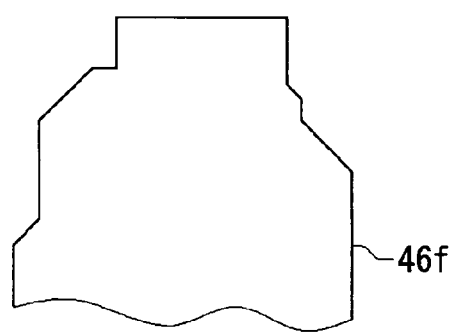
Figure 5G:
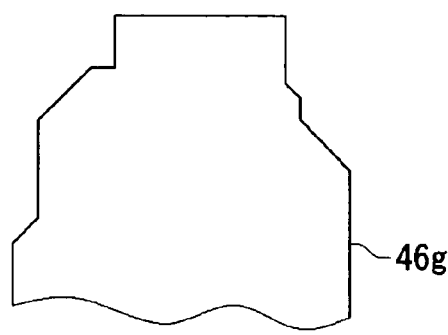
Figure 5H:
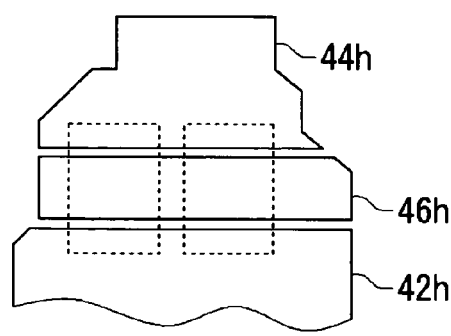

The eighth layer shown in FIG. 5H corresponds to the back surface of the printed-circuit board 40. The printed-circuit board 40 is provided with a third power supply line pattern 42h, a fourth power supply line pattern 44h and a second ground land pattern 46h on the eighth layer thereof. In the same way as with the first layer of FIG. 5A, transmission line type noise filters 10c and 10d are mounted on the third power supply line pattern 42h, the fourth power supply line pattern 44h, and the second ground land pattern 46h.

The third power supply line pattern 42h is connected with the first power supply line pattern 42a formed on the first layer through via holes. As a result, the third power supply line pattern 42h is connected to an output terminal 22 of the power supply circuit 20 mounted on the first layer. The third power supply line pattern 42h is connected to the signal input terminals 12 of the transmission line type noise filters 10c and 10d mounted on the second mounting surface. In other words, the third power supply line pattern 42h makes a connection between the output terminal 22 of the power supply circuit 20 and the signal input terminals 12 of the transmission line type noise filters 10c and 10d.

The fourth power supply line pattern 44h is connected with the second power supply line pattern 44a formed on the first layer by via holes. As a result, the fourth power supply line pattern 44h makes a connection between the signal output terminals 14 of the transmission line type noise filters 10c and 10d mounted on the second mounting surface and the power supply terminal 32 of the microprocessor 30 mounted on the first layer.

The second ground land pattern 46h is connected with the first ground land pattern 46a on the first mounting surface (first layer) by way of via holes, and makes a connection between the ground terminals of the transmission line type noise filters 10c and 10d mounted on the second mounting surface.

The ground land patterns of FIGS. 5B, 5C, 5F and 5G are all connected with the first ground land pattern 46a and the second ground land pattern 46h through via holes. Also, the first power supply line patterns 42, the second power supply line patterns 44 and the ground land patterns 46 of the FIGS. 5D and 5E are connected with the first power supply line patterns 42, the second power supply line patterns 44 and the ground land patterns 46 on the first mounting surface and the second mounting surface, respectively.

In the electronic circuit 100 according to this modification, a plurality of transmission line type noise filters 10 are mounted on both surfaces of a printed-circuit board 40, which raises the board area use efficiency and reduces the mounting area. Moreover, the first power supply line patterns 42 and the second power supply line patterns 44 are formed in a plurality of wiring layers and connected with each other by via holes, which lowers the impedance of wiring and reduces power consumption by the wiring. Further, the ground land patterns 46 are formed in a plurality of wiring layers, which realizes substantially ideal grounding of the transmission line type noise filters 10 or improves isolation between the wirings. As a result, the frequency characteristics of the filters can be improved, and sufficient attenuation characteristics can be achieved over a wide band from low frequencies to high frequencies of several GHz.

The present invention has been described based on the preferred embodiments and modification. It is understood by those skilled in the art that these embodiments are merely exemplary, various modifications to the combination of each component and process thereof are possible and such modifications are also within the scope of the present invention.

A modification has been described using an example of a printed-circuit board 40 having eight wiring layers, but a printed-circuit board 40 including five wiring layers may be used instead. In such a case, the patterns of FIGS. 5A, 5B, 5D, 5F and 5H may be used as the first to fifth layers, respectively. That is, the first power supply line patterns 42, the second power supply line patterns 44, and the ground land patterns 46 may be each formed on the first, the third and the fifth wiring layer in such a way as to overlap each other and connected with each other by via holes, and the ground layers 46 may be provided on the second and the fourth wiring layer.

Furthermore, the total number of printed-circuit boards 40, such as 4, 6, 7 or 10 layers, may be chosen as appropriate in consideration of the impedance of the wirings and the cost of the printed-circuit boards. In such a case, excellent filter characteristics can be produced by arranging the wiring patterns of FIGS. 5A to 5H in combination, and noises occurring in the power supply circuit 20 can be removed, or the leakage of high-frequency noises occurring in the microprocessor 30 to the outside can be prevented effectively and optimally.

It is to be noted that the individual wiring patterns illustrated in FIG. 3, FIGS. 4A to 4C, and FIGS. 5A to 5H are shown as examples only, and those patterns may be designed appropriately according to the peripheral wiring pattern or the disposition of circuit elements. Also, preferably the wiring patterns may be tapered toward the microprocessor 30, thereby saving the wiring area. Also, thicker wiring may be used for the tapered wiring patterns farther from the microprocessor 30 to reduce the impedance.

While the preferred embodiments of the present invention have been described using specific terms, such description is for illustrative purposes only, and it is to be understood that changes and variations may be further made without departing from the spirit or scope of the appended claims.

What is claimed is:

1. An electronic circuit, comprising:
   a power supply circuit which generates a supply voltage to be supplied to an integrated circuit;
   a transmission line type noise filter, comprised of a signal input terminal, a signal output terminal and two ground terminals corresponding respectively to the signal input terminal and the signal output terminal, which removes a high-frequency component of direct-current voltage applied to the signal input terminal and outputs the direct-current voltage from the signal output terminal; and
   a printed-circuit board on which said power supply circuit and said transmission line type noise filter are mounted on a same surface thereof,
   said printed-circuit board including:
      a first power supply line pattern which connects an output terminal of said power supply circuit with the signal input terminal of said transmission line type noise filter;
      a second power supply line pattern which connects the signal output terminal of said transmission line type noise filter with a power supply terminal of the integrated circuit; and
      a ground land pattern, connected with an external ground potential, which makes a connection between the two ground terminals,
   wherein the first power supply line pattern, the second power supply line pattern and the ground land pattern are formed on a mounting surface of said power supply circuit and said transmission line type noise filter.

2. An electronic circuit according to claim 1, wherein said printed-circuit board has a multilayer structure, and
   wherein the first power supply line pattern and the second power supply pattern include at least two wiring patterns which are formed on different layers and connected through via holes.

3. An electronic circuit according to claim 2, wherein said printed-circuit board has a multilayer structure, and
   wherein the ground land pattern includes at least two wiring patterns which are formed on different layers and mutually connected through via holes.

4. An electronic circuit according to claim 2, wherein the transmission line type noise filter is provided in a plurality thereof, and
   wherein the ground land pattern is formed as a single pattern which connects all ground terminals of the plurality of transmission line type noise filters.

5. An electronic circuit according to claim 2, further comprising a transmission line type noise filter mounted on a second mounting surface which differs from a mounting surface of the integrated circuit,
   wherein said printed-circuit board including:
      a third power supply line pattern, connected with the first power supply line pattern through via holes, which connects an output terminal of said power supply circuit with the signal input terminal of said transmission line type noise filter mounted on the second mounting surface;
      a fourth power supply line pattern, connected with the second power supply line pattern through via holes, which connects the signal output terminal of said transmission line type noise filter mounted on the second mounting surface with a power supply terminal of the integrated circuit; and
      a second ground land pattern, connected with the ground land pattern through via holes, which makes a connection between the two ground terminals of said transmission line type noise filter mounted on the second mounting surface,
   wherein the third power supply line pattern, the fourth power supply line pattern and the second ground land pattern are formed on the second mounting surface.

6. An electronic circuit according to claim 2, wherein said printed-circuit board has a multilayer structure and has at least five wiring layers,
   wherein the first power supply line pattern, the second power supply line pattern and the ground land pattern are each formed on a first wiring layer, a third wiring layer and a fifth wiring layer in such a manner as to overlap with one another and are connected through via holes, and
   wherein a ground layer connected with the ground land pattern through via holes are provided on the second wiring layer and the fourth wiring layer.

7. An electronic circuit according to claim 1, wherein said printed-circuit board has a multilayer structure, and
   wherein the ground land pattern includes at least two wiring patterns which are formed on different layers and mutually connected through via holes.

8. An electronic circuit according to claim 1, wherein the transmission line type noise filter is provided in a plurality thereof, and
   wherein the ground land pattern is formed as a single pattern which connects all ground terminals of the plurality of transmission line type noise filters.

9. An electronic circuit according to claim 1, further comprising a transmission line type noise filter mounted on a second mounting surface which differs from a mounting surface of the integrated circuit,
   wherein said printed-circuit board including:
      a third power supply line pattern, connected with the first power supply line pattern through via holes, which connects an output terminal of said power supply circuit with the signal input terminal of said transmission line type noise filter mounted on the second mounting surface;
      a fourth power supply line pattern, connected with the second power supply line pattern through via holes, which connects the signal output terminal of said transmission line type noise filter mounted on the second mounting surface with a power supply terminal of the integrated circuit; and
      a second ground land pattern, connected with the ground land pattern through via holes, which makes a connection between the two ground terminals of said transmission line type noise filter mounted on the second mounting surface,
   wherein the third power supply line pattern, the fourth power supply line pattern and the second ground land pattern are formed on the mounting surface.

10. An electronic circuit according to claim 1, wherein said printed-circuit board has a multilayer structure and has at least five wiring layers,
wherein the first power supply line pattern, the second power supply line pattern and the ground land pattern are each formed on a first wiring layer, a third wiring layer and a fifth wiring layer in such a manner as to overlap with one another and are connected through via holes, and wherein ground layers connected with the ground land pattern through via holes are provided on the second wiring layer and the fourth wiring layer.

* * * * *